United States Patent [19]

Lange

[11] Patent Number: 5,654,670
[45] Date of Patent: Aug. 5, 1997

[54] ACTIVE DISTRIBUTED SIGNAL INJECTOR

[76] Inventor: Julius Lange, 10952 Sweet Oak St., Cupertino, Calif. 95014

[21] Appl. No.: 531,976

[22] Filed: Sep. 20, 1995

[51] Int. Cl.⁶ .................................................. H03F 3/60
[52] U.S. Cl. .................................................. 330/54; 330/286
[58] Field of Search .......................... 330/54, 147, 148, 330/151, 277, 286

[56] References Cited

U.S. PATENT DOCUMENTS

| 3,451,004 | 6/1969 | Miller et al. | 330/54 |
| 4,797,628 | 1/1989 | Gruchalla et al. | 330/54 |

*Primary Examiner*—James B. Mullins
*Attorney, Agent, or Firm*—Anthony W. Karambelas

[57] ABSTRACT

A circuit that injects an auxiliary signal into an existing signal path, thereby adding it to an existing main signal, while minimizing attenuation, distortion, or other perturbation to the main signal. The present invention provides for a active distributed signal injector that includes two transmission lines. An input port is coupled to the first transmission line for receiving the main signal, and a main output port is coupled to an output end of the first transmission line for outputting the main signal. The second transmission line is terminated at an output end and has an injected signal input port at an input end of the second transmission line. A plurality of high impedance amplifiers bridge between the transmission lines, and a plurality of inductors are coupled between each of the high impedance amplifiers. A plurality of transmission lines may be optionally employed in the second transmission line. Optionally, the termination used in the second transmission line may be replaced by a second output port that is used to output the injected signal.

12 Claims, 1 Drawing Sheet

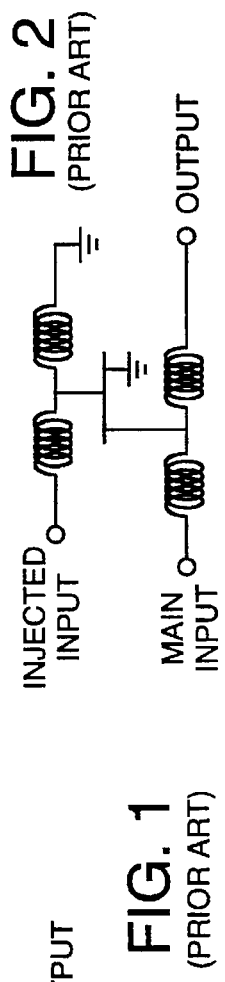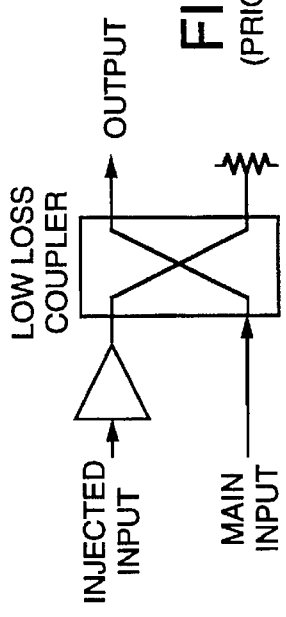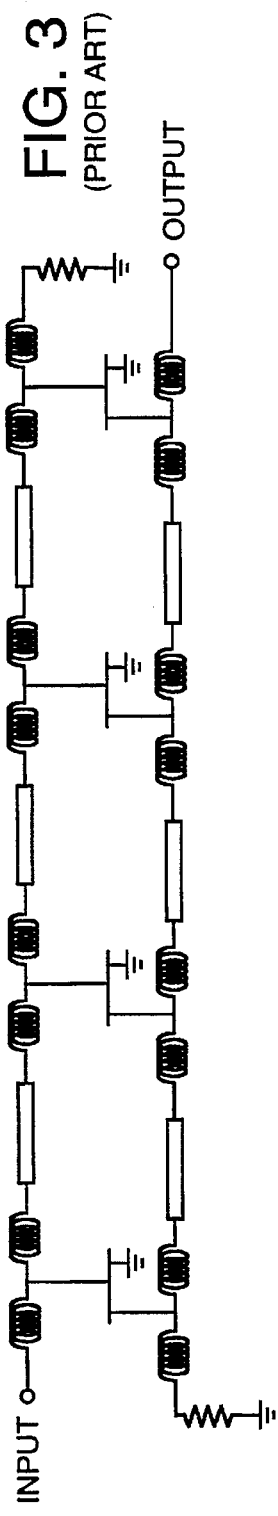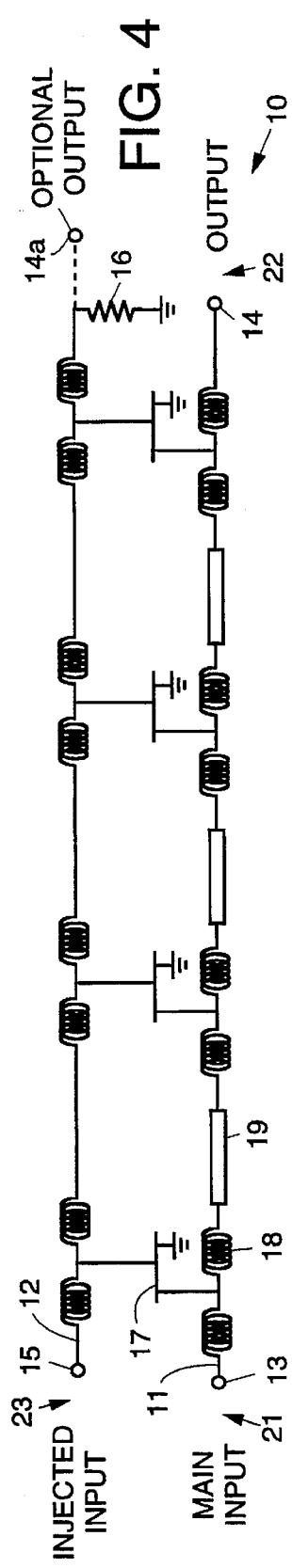

ACTIVE DISTRIBUTED SIGNAL INJECTOR

BACKGROUND

The present invention relates generally to signal injectors, and more particularly, to an active distributed signal injector for use with high frequency systems, whose components are interconnected by low loss constant impedance transmission lines.

In many electronic systems, the need arises to inject an auxiliary signal into an existing signal path, while minimizing attenuation, distortion, or other perturbation of the through signal. Some examples of such systems include interference or distortion cancellation circuits, interference suppressors, feedforward amplifiers, and equipment for testing or monitoring, electronic components and systems.

One prior art signal injection circuit uses a low-loss passive coupler. A loose coupling, typically −20 dB, is used to minimize degradation to the main signal caused by attenuation or distortion in phase and amplitude response. Unfortunately the coupling loss suffered by the injected signal has to be made up by an additional amplifier, most of whose output is wasted in the termination at the output port. Thus, a compromise has to be made between loss to the injected signal and the main signal, but attenuation to either requires additional amplification, which adds its own penalty in signal degradation, power, cost, weight, and space.

Another prior art signal injection circuit uses a high impedance amplifying device, such as a field effect transistor (FET). This circuit avoids the penalty of wasting power in a termination, but, since the circuit has no directivity, half the power is wasted in the source impedance of the main input. This unwanted signal component, which travels in the wrong direction, can also cause other difficulties, such as harmful feedback and reflections. Also, lumping all the amplifying function in one large device, makes impedance matching difficult.

Distributed amplifiers are similar to the present invention. Distributed amplifiers are disclosed in a number of U.S. patents. For example, U.S. Pat. No. 4,359,695 entitled "Electronic amplification systems" discloses a distributed amplifier system allowing easier correction of amplifier errors. This invention provides an electronic amplification system incorporating a distributed amplifier, which system comprises comparison means for comparing the shape of the input control signal with the shape of the final output signal, and for providing a difference signal indicative of any amplifier-induced distortion, correction signal generating means for forming in dependence upon the difference signal a correction signal, and combiner means for combining the correction signal with the final output signal so as substantially to cancel the amplifier-induced distortion.

U.S. Pat. No. 4,845,440 entitled "Distributed amplifier circuits" discloses a wide band amplifier for operation at very high frequencies that comprises a MESFET distributed amplifier having a gate and a drain transmission line, a first hybrid circuit to apply a first and second input signal to opposite ends of the gate transmission line, and a second hybrid circuit connected to opposite ends of the drain transmission line to receive and combine first and second output signals from the drain transmission line to provide an amplified output signal. The use of two input signals traveling in opposite directions along the gate transmission line increases the gain which can be achieved in the distributed amplifier and reduces the noise component of the output signal. This circuit is useful for enhancing the performance of a distributed amplifier containing only a few MESFETs.

U.S. Pat. No. 5,196,805 entitled "Distributed differential amplifier arrangement" discloses an N-stage differential distributed amplifier arrangement. The differential distributed amplifier arrangement includes a parallel connection of N-differential amplifiers. The inputs to the amplifiers are delayed so that the same input is received by each amplifier in sequence at a slightly later time than the preceding amplifier. The outputs of each amplifier are also delayed so that the output of the previous amplifier is added to the output of the next sequential amplifier. Thus, the output is an amplified version of the input. By appropriate grounding of inputs or outputs the differential distributed amplifier arrangement may convert from balanced signals to single-ended signals, from single-ended signals to balanced signals or from two inputs to two outputs.

U.S. Pat. No. 4,797,628 entitled "Distributed push-pull amplifier" discloses a modified distributed amplifier that is capable of providing push-pull operation without the loading losses of conventional push-pull combining. The modified distributed amplifier comprises a distributed amplifier configuration and with signal inverting means, such as a wide bandwidth transmission line transformer, interconnected into both the input and output lines. The signal inverting means are placed at the electrical centers of the lines, but may be placed at any positions in the individual lines to produce optimum performance to specific applications. The separate segments of the distributed amplifier separated by the signal inverting means operate in opposed phase but the signals output to the load add in phase thus providing push-pull operation. Since only one reverse terminating resistor is required, the power normally lost due to the loading by the companion amplifier of a conventional push-pull combined distributed amplifier system is instead delivered to the output load, the use of this type of amplifier preserves the advantages of the distributed amplifier configuration while providing the superior performance of the push-pull configuration but without the losses normally incurred with conventional push-pull combining.

U.S. Pat. No. 5,166,640 entitled "Two dimensional distributed amplifier having multiple phase shifted outputs" discloses a two dimensional distributed amplifier phase shifter having a distributed reference amplifier circuit for generating a reference signal. The reference amplifier circuit has its input connected to one end of a plurality of serially connected microstrip transmission lines. The phase shifter has a plurality of phase shifted amplifier circuits, one associated with each of the microstrip transmission lines. Each phase shifted amplifier circuit has an input connected to an end of its associated microstrip transmission line which is opposite the reference amplifier circuit and generates an output signal, phase shifted from the reference signal or the output signal of an adjacent phase shifted amplifier by a predetermined phase angle.

U.S. Pat. No. 5,177,381 entitled "Distributed logarithmic amplifier and method" discloses a logarithmic amplifier with amplifier stages having an input transmission line and first and second output transmission lines. The input and output transmission lines are coupled by multiple amplifier elements distributed along the transmission lines. One output transmission line forms a high gain low compression path and the other a low gain high compression path. The output transmission lines of each stage are coupled to a combiner from whence the logarithmically amplified output signal is obtained. The logarithmic amplifier stages are readily constructed in MMIC form and multiple stages may be easily cascaded to provide a very large dynamic range.

U.S. Pat. No. 4,752,746 entitled "Wideband microwave matrix amplifier" discloses a microwave amplifier that multiplicatively and additively amplifies microwave frequency signals. The matrix amplifier is a distributed amplifier with two or more tiers (rows) of transistors. Each tier has a plurality of transistors that additively amplify the signal entering that row of the amplifier, and each row multiplicatively amplifies the output of the previous row. The gates of the transistors in each row are sequentially coupled to an input transmission line having a series of transmission elements. The outputs of all the transistors from each row are sequentially coupled to the input transmission line of the next tier, except that the outputs of the last tier are coupled to an output transmission line for transmitting the output of the amplifier to an output node. Each transmission lines has at least one line termination at one of its ends for absorbing signals incident on that end of the transmission line, and biasing means for DC biasing the transmission line at a corresponding voltage potential.

U.S. Pat. No. 5,070,304 entitled "Distributed combiner power amplifier and method" discloses a distributed amplifier usable in the gigahertz frequency range for radar and electronic warfare applications. In the amplifier stage, a combination of optimum amplifier stage loading, a reflection canceling output network, and an amplifier capacitance hiding input arrangement are employed.

Other U.S. patents relate to feedforward amplifiers. These include, for example, U.S. Pat. No. 4,359,695 entitled "Electronic amplification systems" cited above, and U.S. Pat. No. 4,359,696 entitled "Amplifiers" which discloses a feedforward amplifier that compensates for distortions introduced by a main amplifying device by comparing the amplified signal with the original unamplified signal and producing a correction signal, which is related to the difference. The correction signal is combined with the main amplified signal at a combiner. The combiner takes the form of a tetrode or pentode valve which acts as a current source and which is designed so as to constitute part of an output transmission line having a predetermined characteristic impedance. By this means the combiner does not adversely affect the main amplified signal and the capacitance inevitably associated with a tetrode or pentode valve is utilized as part of the reactance of the transmission line and does not adversely affect the frequency response of the amplifier.

U.S. Pat. No. 4,885,551 entitled "Feed forward linear amplifier" discloses a feed forward circuit receives an input signal having at least one carrier therein in a prescribed frequency range. The input signal is applied to a first circuit path having a power amplifier that produces an output signal with a distortion component and to a second circuit path that delays the input signal without distortion. The output signal of the first circuit path is combined with the output signal of the second circuit path to form a signal representative of the distortion component of the first circuit path output signal and the distortion component representative signal is subtracted from the output signal of the first circuit path to cancel the distortion component therein. The prescribed frequency range of the first circuit path output is scanned to detect a carrier signal and the amplitude and phase of the signal in the first circuit path is modified to minimize the magnitude of the detected carrier in the distortion representative signal.

While these last-cited U.S. patents discuss feedforward amplifiers, none feature distributed amplifiers with two input signals, one of which is amplified using active devices, while the other is passed through without active amplification. Active amplification is prone to introduce distortion. The present invention could form part of a feedforward amplifier, but it is not in itself a feedforward amplifier.

Accordingly, it is an objective of the present invention to provide an active distributed signal injector for use with high frequency systems, whose components are interconnected by low loss constant impedance transmission lines.

SUMMARY OF THE INVENTION

To meet the above and other objectives, the present invention is a new type of signal processing element, referred to as an active distributed signal injector. The active distributed signal injector injects an auxiliary signal into an existing signal path, thereby adding it to an existing main signal, while minimizing attenuation, distortion, or other perturbation to the main signal. The active distributed signal injector includes first and second transmission lines, and an input port coupled to the first transmission line for receiving the main signal by way of an input transmission line. An output port is coupled to an output end of the first transmission line for outputting the main signal by way of an output transmission line. The second transmission line is typically terminated at an output end and has an injected signal input port at an input end for receiving the injected signal. Optionally, the output termination may be replaced by a second output port. The first and second transmission lines are bridged by a plurality of high impedance amplifying elements, such as FET devices, that transfer the main signal from the input to the output line, amplifying it in the process. A plurality of inductors are coupled between each of the high impedance amplifiers. A plurality of impedance transmission lines may be optionally coupled between respective ones of the inductors disposed between the high impedance amplifiers of the second transmission line.

The present invention is based on the principle of distributed amplification, which makes it particularly applicable to high frequency systems, whose components are interconnected by low loss constant impedance transmission lines. The present invention is similar to a distributed amplifier but the termination of the output transmission line is replaced with an additional input port for receiving the main signal.

The present invention minimizes attenuation, distortion, or other perturbations to the main signal, and does not cancel or suppress distortion. The prior art references cited above are generally unrelated to the present invention. Some of the references are or employ distributed amplifiers, but none feature distributed amplifiers with two output signals, one of which is amplified using active devices, and wherein the other is passed through the circuit without active amplification. Active amplification is prone to introduce distortion.

The present invention achieves directivity and low loss simultaneously. The present invention provides for minimal perturbation of the main signal, resulting in low distortion in phase and amplitude response, resulting in preservation of bandwidth, low dispersion, low loss, and lower loss to the injected signal. Therefore, less amplification of the injected signal is needed, and less signal degradation, power, weight, and space, and less cost is required, and it is easily implemented in MMIC form. The signal injection is directional and thus there is lower VSWR and less interaction and interference between signals.

The present invention may be employed with interference or distortion cancellation circuits such as adaptive filters, adaptive equalizers such as adaptive baseband equalizers and transversal filter equalizers at IF, interference suppressers such as adaptive cross polarization interference cancelers, and adaptive phased arrays, feedforward amplifiers, and equipment for testing or monitoring, electronic components and systems.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 shows prior art signal injection using a passive coupler;

FIG. 2 shows prior art signal injection using a high impedance device;

FIG. 3 shows prior art distributed amplifier; and

FIG. 4 shows an active distributed signal injector in accordance with the present invention.

DETAILED DESCRIPTION

Referring to the drawing figures, FIG. 1 shows a prior art signal injecting circuit using a passive coupler. Loose coupling, typically −20 dB, is used to minimize degradation to the main signal caused by attenuation or distortion in phase and amplitude response. Unfortunately the coupling loss suffered by the injected signal has to be made up by an additional amplifier, most of whose output is wasted in the termination at the output port. Thus, a compromise must be made between loss to the injected signal and the main signal, but attenuation to either requires additional amplification, which adds its own penalty in signal degradation, power, cost, weight, and space.

FIG. 2 shows a prior art signal injecting circuit using a high impedance device, such as a field effect transistor (FET). This circuit avoids the penalty of wasting power in a termination, but, since the circuit has no directivity, half the power is wasted in the source impedance of the main input. This unwanted signal component, which travels in the wrong direction, could also cause other difficulties. Also, lumping all the amplifying function in one large device, makes impedance matching difficult.

FIG. 3 shows a prior art distributed amplifier that is somewhat similar to the present invention. The prior art distributed amplifier shown in FIG. 3 omits components for DC bias and other ancillary circuitry. The distributed amplifier employs two terminated transmission lines, an input line and an output line, bridged by high impedance amplifiers. These amplifiers, shown as Flit devices, transfer the signal from the input line to the output line, amplifying it in the process. The transmission lines are implemented in lumped form with the amplifiers providing shunt capacitance. In the distributed amplifier of FIG. 3, the input transmission line is terminated at its output and the output transmission line is terminated at its input.

FIG. 4 shows a preferred embodiment of an active distributed signal injector 10 in accordance with the present invention, omitting components for DC bias and other ancillary circuitry. The active distributed signal injector 10 is based on the principle of distributed amplification, which makes it particularly applicable to high frequency systems.

The active distributed signal injector 10 comprises first and second transmission lines 11, 12. A first input port 13 is coupled to a first end of the first transmission line 11 that comprises an input line 21. A main signal output port 14 is coupled to a second end of the first transmission line 11 that comprises an output line 22. An injected signal input port 15 is coupled to a first end of the second transmission line 12 by way of a second input line 23. A termination 16 is coupled to a second end of the second transmission line 12. Optionally, the termination 16 may be replaced by a second output port 14a that is used to output the injected signal.

The first and is second transmission lines 11, 12 are bridged by a plurality of high impedance amplifiers 17. Each of the high impedance amplifiers 17 are coupled together using series inductors 18. The series inductors 18 employed in the second transmission line 12 may be optionally interconnected by conventional transmission lines 19. In general both of the first and second transmission lines 11, 12 comprise low loss constant impedance transmission lines 11, 12. The inductance provided by the plurality of inductors 18 is taken into account in designing the transmission lines 11, 12.

The active distributed signal injector 10 is similar to the prior art distributed amplifier shown in FIG. 3. The differences are that the termination of the input transmission line of the distributed amplifier is replaced by the main signal port 13 for the main signal, while the injected signal is input to the primary input of the distributed amplifier. Also care must be used so that the main input transmission line 21 is low loss, low VSWR, and non-dispersive. This effects the design tradeoffs for the amplifying device 17 and the other components. The active distributed signal injector 10 of the present invention may be easily implemented as microwave monolithic integrated circuits.

The active distributed signal injector 10 injects the auxiliary signal, while minimizing attenuation, distortion, or other perturbation to both the injected (auxiliary) signal and the main signal. The present invention minimizes attenuation, distortion, or other perturbations to the injected and main signals, and does not cancel or suppress distortion.

The active distributed signal injector 10 provides for low perturbation of the main signal, resulting in low distortion in phase and amplitude response, which preserves bandwidth, and provides for low dispersion, low loss, and lower loss to the main signal. Therefore, less amplification of the sampled signal is needed, and less signal degradation, power, weight, and space, and less cost is required, and it is easily implemented in MMIC form. The active distributed signal injector 10 may be employed with interference or distortion cancellation circuits such as adaptive filters, adaptive equalizers such as adaptive baseband equalizers and transversal filter equalizers at interference suppressers such as adaptive cross polarization interference cancelers, and adaptive phased arrays, feedforward amplifiers, and equipment for testing or monitoring, electronic components and systems.

Thus, an active distributed signal injector for use with high frequency systems, whose components are interconnected by low loss constant impedance transmission lines has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An active distributed signal injector comprising:

a first transmission line;

a second transmission line;

a main signal input port coupled to a first end of the first transmission line;

a main signal output port coupled to a second end of the first transmission line;

an injected signal input port coupled to a first end of the second transmission line;

a termination coupled to a second end of the second transmission line;

a plurality of high impedance amplifiers bridging between the furst and the second transmission lines; and a plurality of inductors respectively disposed along the first and second transmission lines between each of the high impedance amplifiers.

2. The active distributed signal injector of claim 1 further comprising a plurality of transmission lines coupled between selected ones of the inductors of the second transmission line.

3. The active distributed signal injector of claim 1 wherein the plurality of high impedance amplifiers each comprise field effect transistors.

4. The active distributed signal injector claim 1 which is implemented as a microwave monolithic integrated circuit.

5. The active distributed signal injector of claim 2 wherein the plurality of high impedance amplifiers each comprise field effect transistors.

6. The active distributed signal injector claim 2 which is implemented as a microwave monolithic integrated circuit.

7. An active distributed signal injector comprising:

a first transmission line;

a second transmission line;

a main signal input port coupled to a first end of the first transmission line;

a main signal output port coupled to a second end of the first transmission line;

an injected signal input port coupled to a first end of the second transmission line;

a second output port coupled to a second end of the second transmission line that is used to output the injected signal, a plurality of high impedance amplifiers bridging between the first and is second transmission lines; and a plurality of inductors respectively disposed along the first and second transmission lines between each of the high impedance amplifiers.

8. The active distributed signal injector of claim 7 further comprising a plurality of transmission lines coupled between selected ones of the inductors of the second transmission line.

9. The active distributed signal injector of claim 7 wherein the plurality of high impedance amplifiers each comprise field effect transistors.

10. The active distributed signal injector claim 7 which is implemented as a microwave monolithic integrated circuit.

11. The active distributed signal injector of claim 8 wherein the plurality of high impedance amplifiers each comprise field effect transistors.

12. The active distributed signal injector claim 8 which is implemented as a microwave monolithic integrated circuit.

\* \* \* \* \*